(12) United States Patent
Lukens et al.

(10) Patent No.: US 7,309,987 B2
(45) Date of Patent: Dec. 18, 2007

(54) ANTICIPATIVE TEMPERATURE REGULATION OF CRYOGENIC NMR PROBES

(75) Inventors: Peter Lukens, Tucson, AZ (US); Atholl Gibson, Walnut Creek, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/260,988

(22) Filed: Oct. 28, 2005
(Under 37 CFR 1.47)

(65) Prior Publication Data
US 2007/0096734 A1  May 3, 2007

(51) Int. Cl.
*G01V 3/00* (2006.01)
(52) U.S. Cl. ..................................... 324/315
(58) Field of Classification Search ......... 324/300–322
See application file for complete search history.

(56) References Cited

U.S. PATENT DOCUMENTS

| | | | |
|---|---|---|---|
| 5,739,689 A | 4/1998 | Roth et al. | |
| 5,889,456 A | 3/1999 | Triebe et al. | |
| 6,677,751 B1 | 1/2004 | Marek et al. | |
| 6,812,705 B1 * | 11/2004 | Sellers | 324/318 |
| 6,825,664 B2 * | 11/2004 | Kwok et al. | 324/318 |
| 6,838,880 B2 | 1/2005 | Hofmann et al. | |
| 7,015,692 B2 * | 3/2006 | Clarke et al. | 324/300 |
| 2002/0073717 A1 * | 6/2002 | Dean et al. | 62/50.7 |

* cited by examiner

*Primary Examiner*—Brij Shrivastav
*Assistant Examiner*—Dixomara Vargas
(74) *Attorney, Agent, or Firm*—Bella Fishman

(57) ABSTRACT

In some embodiments, a nuclear magnetic resonance (NMR) method comprises generating an indicator of an anticipated time-averaged power for a radio-frequency (RF) pulse set, and anticipatively adjusting a cooling supplied by a cryogenic cooling fluid to an RF coil according to the indicator of the anticipated time-averaged power. The cryogenic cooling adjustment may be performed using a cryogenic fluid heater and/or a mass flow controller disposed in the cryogenic fluid path. The time difference between the start of the cooling adjustment and the start of the RF pulse set is set to be equal to the difference in timescales between the cooling effect of the cooling adjustment and the heating effect of the RF pulse set on the RF coil.

19 Claims, 3 Drawing Sheets

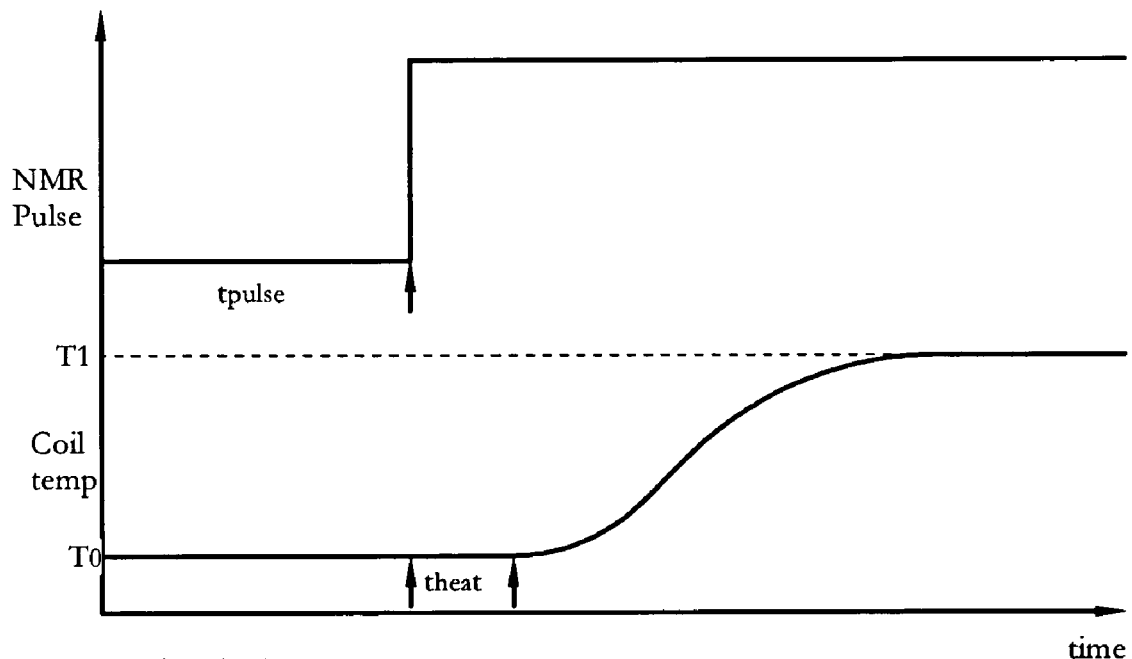
FIG. 4-A
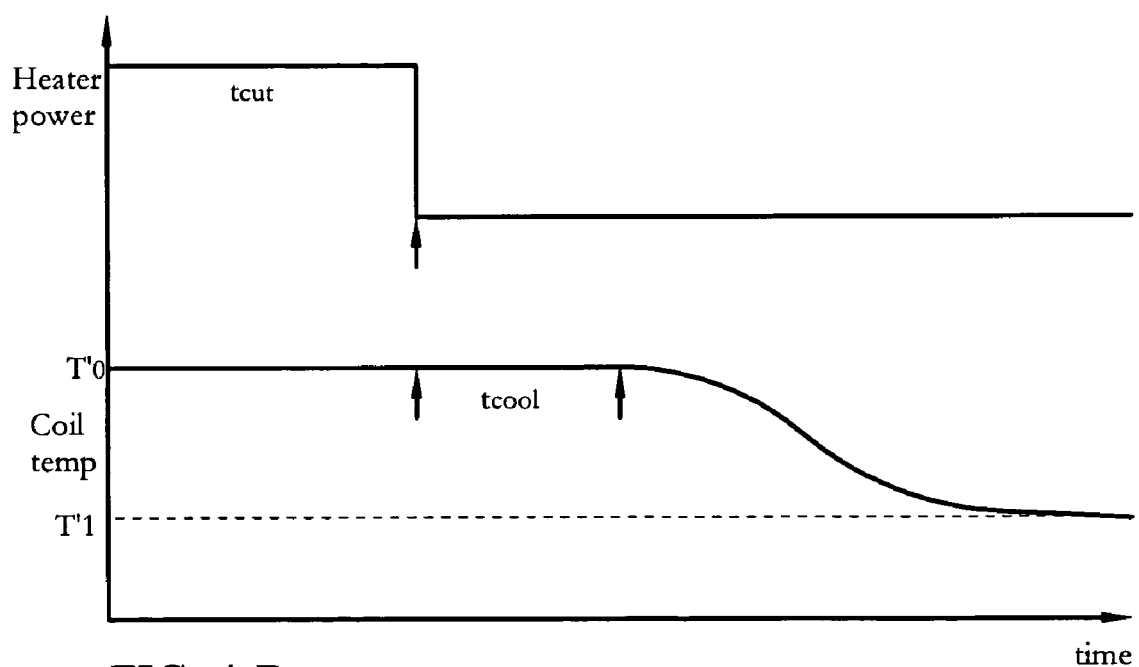
FIG. 4-B

ANTICIPATIVE TEMPERATURE REGULATION OF CRYOGENIC NMR PROBES

BACKGROUND OF THE INVENTION

The invention relates to nuclear magnetic resonance (NMR) spectroscopy, and in particular to systems and methods for regulating coil temperatures in NMR spectrometers.

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The direction of the static magnetic field $B_0$ is commonly denoted as the z-axis or longitudinal direction, while the plane perpendicular to the z-axis is commonly termed the x-y or transverse direction. The RF coils are typically provided as part of an NMR probe, and are used to analyze samples situated in sample tubes or flow cells.

Some NMR systems employ a cryogenically-cooled NMR probe. A cryogenic fluid such as liquid nitrogen or liquid/gaseous helium conductively cools NMR circuit components such the NMR RF coils, circuits and preamplifiers. The sample of interest may be held at room temperature or at a different temperature than the cryogenically-cooled circuit components. Examples of U.S. Patents describing cryogenically-cooled NMR probes include U.S. Pat. Nos. 6,838,880, 6,677,751, 5,889,456 and 5,739,689.

SUMMARY OF THE INVENTION

According to one aspect, a nuclear magnetic resonance method comprises generating an indicator of an anticipated time-averaged power for a radio-frequency pulse set, anticipatively adjusting a cooling supplied by a cooling fluid to a radio-frequency coil according to the indicator of the anticipated time-averaged power, and performing a nuclear magnetic resonance measurement on a sample by using the radio-frequency coil to apply the radio-frequency pulse set to the sample.

According to another aspect, a nuclear magnetic resonance method comprises anticipatively counteracting a thermal effect of power dissipation in a nuclear magnetic resonance circuit by adjusting a cooling supplied by a cryogenic cooling fluid to the nuclear magnetic resonance circuit for a cooling time period preceding a heating effect of an application of radio-frequency power to the nuclear magnetic resonance circuit. A radio-frequency pulse set is applied to the nuclear resonance circuit to perform a nuclear magnetic resonance measurement on a sample.

According to another aspect, a nuclear magnetic resonance apparatus comprises a nuclear magnetic resonance probe comprising a radio-frequency coil; a cryogenic cooling fluid conduit for establishing a thermal communication between a cryogenic cooling fluid and the radio-frequency coil; a cryogenic cooling regulator fluidically coupled to the cryogenic cooling conduit and configured to control a cooling supplied by the cryogenic cooling fluid to the radio-frequency coil; and a cooling control system connected to the cryogenic cooling regulator. The cooling control system is configured to generate an indicator of an anticipated time-averaged power for a radio-frequency pulse set to be applied using the radio-frequency coil, and control the cryogenic cooling regulator to anticipatively adjust the cooling supplied by the cryogenic cooling fluid to the radio-frequency coil according to the indicator of the anticipated time-averaged power.

BRIEF DESCRIPTION OF THE DRAWINGS

The foregoing aspects and advantages of the present invention will become better understood upon reading the following detailed description and upon reference to the drawings where:

FIG. 4-A shows an exemplary time dependence of an RF coil temperature following application of an NMR RF pulse, in the absence of anticipative cooling power adjustment, according to some embodiments of the present invention.

FIG. 4-B shows an exemplary time dependence of an RF coil temperature following a cooling power increase, in the absence of a corresponding RF pulse sequence, according to some embodiments of the present invention.

DETAILED DESCRIPTION OF THE INVENTION

In the following description, a set of elements includes one or more elements. Any reference to an element is understood to encompass one or more elements. All recited connections are operative connections. Unless otherwise stated, any recited electrical or mechanical connections can be direct connections or indirect connections through intermediary structures. Unless otherwise required, any described sequence of steps encompasses sequences performed in the illustrated order, as well as sequences of steps performed in other orders. Each recited element or structure can be formed by or be part of a monolithic structure, or be formed from multiple distinct structures. The statement that a coil is used to perform a nuclear magnetic measurement on a sample is understood to mean that the coil is used as transmitter, receiver, or both. Unless otherwise stated, the term cryogenic refers to temperatures about equal to or lower than 110 K. Computer readable media encompass storage media such as magnetic, optic, and semiconductor media (e.g. hard drives, optical disks, flash memory, DRAM), as well as communications links such as conductive cables and fiber optic links. The statement that a cooling adjustment is performed anticipatively means that a cooling fluid adjustment is performed before a manifestation of heating effects of a subsequent radio-frequency pulse set. An indicator of a quantity may be the quantity itself, or an indicator distinct from the quantity.

The following description illustrates embodiments of the invention by way of example and not necessarily by way of limitation.

Figure 1:
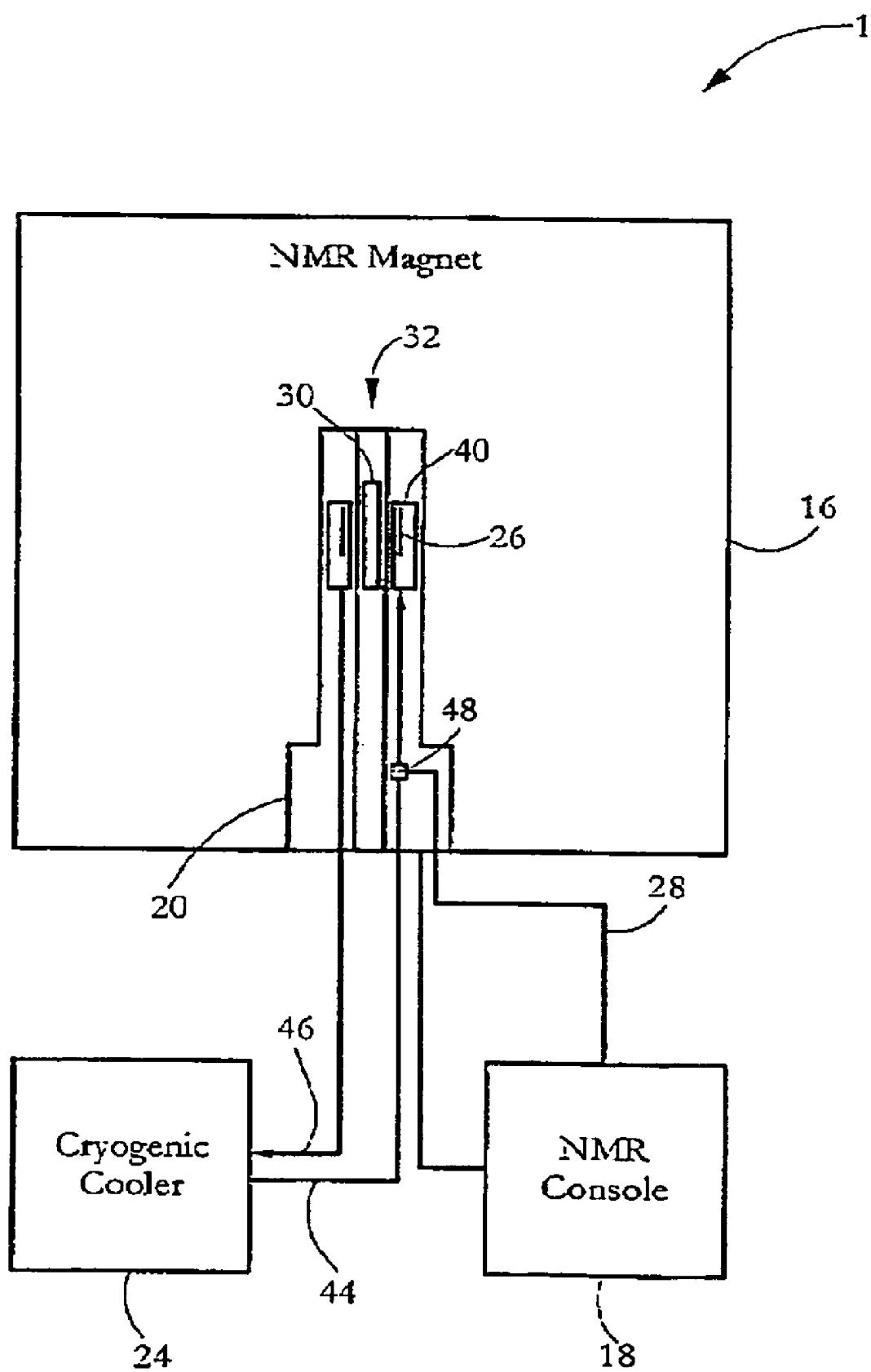
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, an NMR console 18 electrically connected to magnet 16 and probe 20, and a cryogenic cooler 24 fluidically connected to NMR probe 20. NMR console 18 comprises electronic components configured to apply desired radio-frequency pulses to probe 20, and to acquire data indicative of the nuclear magnetic resonance properties of NMR samples within probe 20. In some embodiments, NMR console 18 comprises a temperature controller for controlling a cryogenic fluid cooling power supplied to probe 20 as described below. In some embodiments, a temperature controller may be provided as a stand-alone unit electrically connected to NMR console 18 and probe 20. Probe 20 includes one or more radio-frequency (RF) coils 26 and associated electrical circuit components. Coils 26 and various components 28 connected to coils 26 form one or more NMR measurement circuits. For simplicity, the A sample container 30 is positioned within probe 20, for holding an NMR sample of interest within coil 26 while measurements are performed on the sample. Sample container 30 can be a sample tube or a flow cell. Sample container 30 is disposed within a longitudinal central bore 32 of probe 20. A temperature-control gas such as air or nitrogen may flow through central bore 32, along the side walls of sample container 30, to control the temperature of sample container 30. For example, in applications in which measurements are to be performed at an elevated temperature, heated air or nitrogen may be passed along sample container 30 in order to heat up the sample of interest.

Coils 26 and associated components are held within a cryostat 40, which is fluidically connected to cryogenic cooler 24 through inlet and outlet cryogen conduits 44, 46, respectively. Coils 26 are thermally coupled to a cryogenic fluid such as liquid or gaseous nitrogen or helium flowing from cryogenic cooler 24 through inlet conduit 44 into cryostat 40, and back to cryogenic cooler 24 through outlet conduit 46. In some embodiments, coils 26 may be in direct contact with the cryogenic fluid. For example, coils 26 may be immersed in the fluid, or form a conduit through which the fluid passes. In some embodiments, coils 26 may be indirectly thermally coupled to the cryogenic fluid through a thermally conductive cooled support. In some embodiments, cryogenic cooler 24 may include a heat capacity enhancer such as a volume of lead shot or rare earth shot over which the cryogenic cooling fluid runs in its normal circuit. The heat capacity enhancer may allow a reduction in the size and cost of cryogenic cooler 24.

A cooling regulator 48 is coupled to inlet cryogen conduit 44. In some embodiments, cooling regulator 48 comprises a cryogen flow controller such as a mass flow controller, In some embodiments, cooling regulator 48 comprises a heater. Under the control of NMR console 18, cooling regulator 48 controls the cooling provided by the cryogenic fluid to coils 26 and associated components, as described below. In some embodiments, cooling regulator 48 may be provided as part of cryogenic cooler 24, or be thermally coupled to cryogenic cooler 24, and may determine a cooling temperature to which cryogenic cooler 24 cools the circulating cryogenic fluid. In some embodiments, cooling regulator 48 may include multiple such devices (e.g. heater(s), mass flow controller(s)) used in combination.

Figure 2:
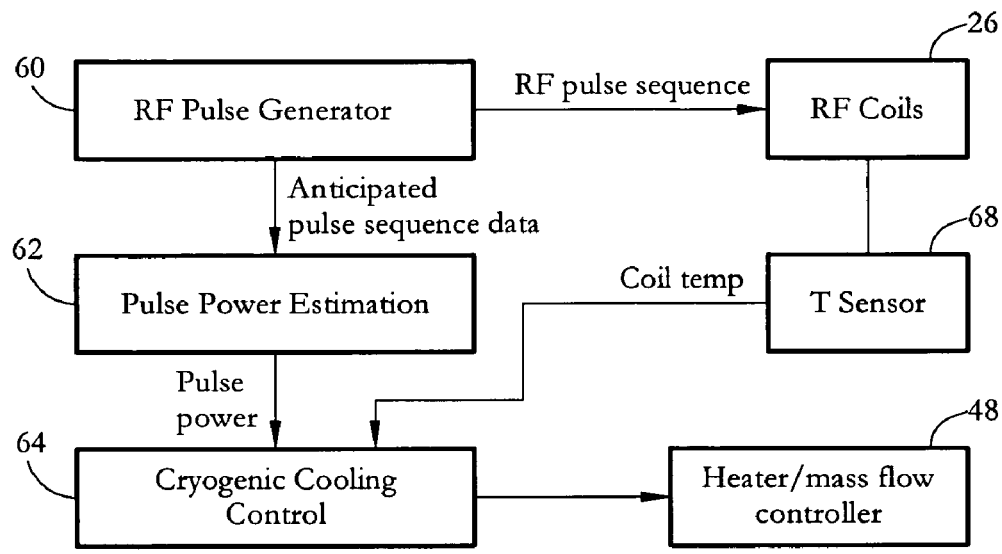
FIG. 2 is a schematic diagram of a temperature-regulation part of the spectrometer of FIG. 1 according to some embodiments of the present invention.

FIG. 2 shows a schematic diagram of part of NMR console 18 and probe 20 according to some embodiments of the present invention. In some embodiments, an RF pulse generator 60, a pulse power estimation unit 62, and cryogenic cooling control unit 64 are implemented in software running on NMR console 18, while coils 26, cooling regulator 48 and a temperature sensor 68 are provided as part of probe 20. In some embodiments, one or more of the computational units shown in FIG. 2, e.g. pulse power estimation unit 62 and cryogenic cooling control unit 64, may be provided as part of a stand-alone unit connected to NMR console 18. Temperature sensor 68 is thermally coupled to RF coils 26, and generates signals indicative of the temperature(s) of RF coils 26. RF pulse generator 60 generates RF pulse sequences which are sent to RF coils 26 to perform NMR measurements. RF pulse generator 60 also sends data on anticipated RF pulse sequences to pulse power estimation unit 62, which uses the received data to estimate a time-averaged power for the pulse sequences. The average pulse power data is used by cryogenic cooling control unit 64 to control cooling regulator 48 as described below. In some embodiments, cryogenic cooling control unit 64 may also employ coil temperature data fed back from temperature sensor 68 to control cooling regulator 48.

Figure 3:
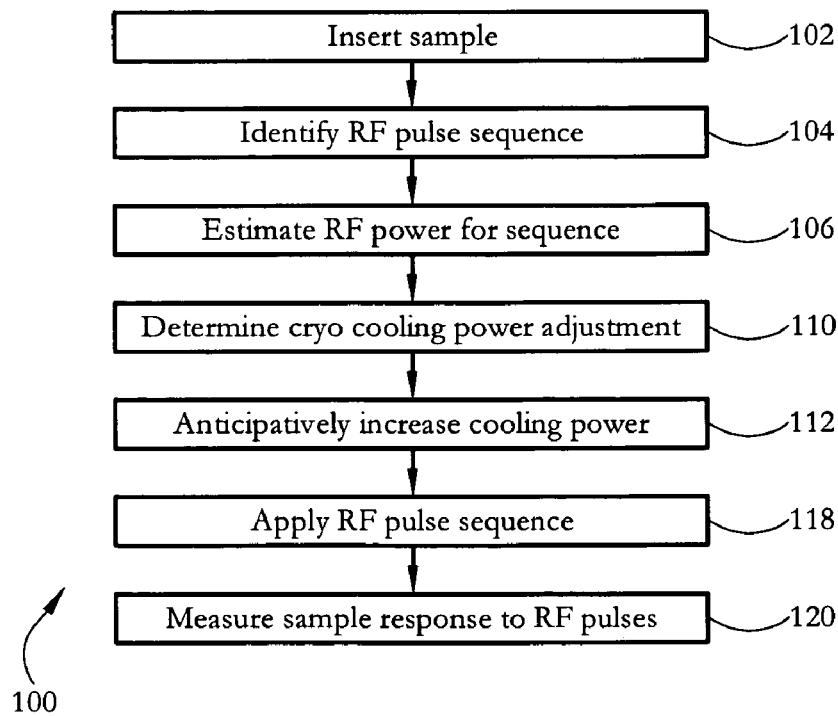
FIG. 3 illustrates a sequence of steps performed in a measurement method according to some embodiments of the present invention.

FIG. 3 shows a sequence of steps 100 performed by NMR spectrometer 12 according to some embodiments of the present invention. In a step 102, a sample is inserted into a measurement space defined within coils 26, where magnet 16 applies a static magnetic field $B_0$ to the sample. The sample insertion step 102 may be performed before, concurrently with, or after a set of pre-measurement steps described above. In a step 104, NMR console 18 identifies/selects an RF pulse sequence to be applied to a sample of interest, and determines an RF power dissipation resulting from the RF pulse sequence. NMR console 18 computes an estimate of a dissipated RF power caused by the RF pulse sequence to be applied (step 106). In a step 110, NMR console 18 determines a cooling power adjustment to be applied according to the dissipated RF power estimate, in order to anticipatively offset the heating effect of the dissipated RF power on the RF coils. The cooling power adjustment is preferably chosen so that the heat dissipated by the RF pulses is substantially equal to the increase in heat removal from the RF coils. In a system in which cooling regulator 48 comprises a cryogen heater, determining the cooling power adjustment may include determining an increase in heater power (and consequently, cryogen temperature) to be applied for a period of time. In a system in which cooling regulator 48 comprises a mass flow controller, determining the cooling power adjustment may include determining an increase in cryogen flow to be applied for a period of time. In some embodiments, determining the cooling power adjustment may include determining a temperature to which the cryogenic fluid is cooled. In embodiments using combinations of different cooling regulators, determining the cooling power adjustment may include determining multiple adjustments (e.g. heater, mass flow) to be applied using the different cooling regulators.

In a step 112, NMR console 18 controls cooling regulator 48 to anticipatively increase the cooling power provided to probe 20 according to the determined cooling power adjustment. Various cooling power adjustments may be performed before, during and after the application of RF pulses, as needed. Coils 26 are used to apply radio-frequency magnetic fields $B_1$ to the sample (step 118), and to measure the response of the sample to the applied magnetic fields (step 120). The RF power application step 118 is performed after the anticipative cooling power adjustment step 112 described above. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

To illustrate the problem of NMR circuit temperature excursions (heating) due to RF pulsing, consider a constant-amplitude RF pulse starting at a time $t=t_{pulse}$, as shown in the upper curve of FIG. 4-A. Such a pulse may have the same time-averaged RF power as a pulse sequence including multiple RF pulses having different durations and/or amplitudes. The lower curve of FIG. 4-A illustrates schematically a potential RF coil temperature excursion resulting from the application of the RF pulse in the absence of cryogenic cooling power adjustment. After a delay $t=t_{heat}$, the coil structure temperature begins to rise from an original temperature $T_0$ to a new equilibrium temperature $T_1$. The delay $t_{heat}$ is due to heat capacity and thermal conductivity limitations of the coil structures and temperature sensor.

FIG. 4-B illustrates schematically the effect on coil temperature of increased cryogenic cooling, achieved for example by reducing heater power. The top curve shows heater power, while the lower curve shows coil temperature. Initially, at time t=0, a fixed level of heater current is used to maintain the coil structures at a set temperature $T'_0$. At a time $t=t_{cut}$, the heater current is reduced to a lower level. After a delay $t=t_{cool}$, the measured temperature of the coil structures begins to drop from $T'_0$ toward a new equilibrium temperature $T'_1$. The delay $t_{cool}$ is caused by a delay/time constant associated with conduction of heat between the electrical heater and the cryogen, a delay/time constant associated with the time the cryogen takes to flow from the heater location to a heat exchanger or other structure that cools the relevant probe components, and a delay/time constant for conductive heat exchange between the probe components and the cryogen. For a system using a flow controller, the coil delay is caused by the delay/time constant associated with an increase in flow at the coil/heat exchanger location, and the delay/time constant for conductive heat exchange between the probe components and the cryogen. Cryogen flow control may allow quicker cooling of probe components than heater-power control. At the same time, heater power control may allow finer adjustments than cryogen flow control. In some embodiments, cryogen flow control is used to make a coarse cooling adjustment, while heater power control is used to make a fine cooling adjustment.

In some embodiments, NMR console 18 (FIG. 1) adjusts the cryogenic cooling power (e.g. reduces the probe heater power, increases the cryogen flow, or combinations thereof) at a time $$t=t_{pulse}-(t_{cool}-t_{heat}). \qquad [1]$$

According to equation [1], the cooling power adjustment is commenced before the start of the RF pulse sequence, and the time difference between the cooling adjustment start and the RF pulse sequence start is equal to the difference between the cooling and heating timescales. If the cooling and heating timescales are roughly equal, the cooling adjustment can be started about the same time as the RF pulse sequence. If the cooling timescale is longer than the heating timescale, as is likely in many applications, the cooling adjustment is started before the RF pulse sequence. If the cooling timescale is shorter than the heating timescale, the cooling adjustment may be started after the RF pulse sequence. The cooling adjustment is preferably applied so that the RF coil temperature remains substantially constant over time.

The cooling and heating timescales may generally depend on the probe and cryogen conduit structures, and may be determined empirically for a given system. The system settings leading to a desired cooling power adjustment may also be determined empirically for a given system. For example, in some embodiments, a table showing heating power reductions and/or cryogen flow increases that compensate for various anticipated average RF pulse powers may be generated empirically, and used thereafter during the operation of the spectrometer.

In some embodiments, cooling power adjustments as described above are performed continuously/periodically, before, during and after the application of RF pulses, as needed to maintain a constant RF coil temperature. For example, the NMR console may compute a moving average of anticipated power dissipation, and continuously/periodically anticipatively adjust the cryogenic cooling power according to eq. [1]. The moving average timescale may be chosen to be comparable to the timescales for heating and/or cooling, or the longer of the two timescales. In such embodiments, eq. [1] may be used at multiple time points along an RF pulse sequence.

In some embodiments, an anticipative cooling adjustment scheme as described above is used in conjunction with a reactive, feedback-based scheme. A feedback-based scheme employs signals from a temperature sensor thermally coupled to the RF coils to adjust the cryogenic cooling power according to detected temperature variations. The cryogenic cooling is reduced if the detected RF coil temperature decreases, and the cryogenic cooling is increased if the detected RF coil temperature increases.

In some embodiments, the present invention further provides computer-readable media encoding instructions to perform the temperature-regulation and NMR measurement method steps described above.

The above embodiments may be altered in many ways without departing from the scope of the invention. Accordingly, the scope of the invention should be determined by the following claims and their legal equivalents.

What is claimed is:

1. A method of temperature regulation of NMR probe coils for performing nuclear magnetic resonance measurements comprising:
   generating an indicator of an anticipated time-averaged power for a radio-frequency pulse set;
   anticipatively adjusting a cooling supplied by a cooling fluid to a radio-frequency coil according to the indicator of the anticipated time-averaged power for stabilizing a temperature of the radio-frequency coil; and
   performing a nuclear magnetic resonance measurement on a sample by using the radio-frequency probe coil with the stabilized temperature to apply the radio-frequency pulse set to the sample to obtain data from sample of interest.

2. The method of claim 1, wherein adjusting the cooling comprises variably obstructing a flow of the cooling fluid.

3. The method of claim 2, comprising employing a mass flow controller disposed along a cooling fluid inlet conduit leading to the radio-frequency coil to variably obstruct the flow of the cooling fluid.

4. The method of claim 1, wherein adjusting the cooling comprises controlling a heating of the cooling fluid.

5. The method of claim 4, comprising employing a heater disposed along a cooling fluid inlet conduit leading to the radio-frequency coil to control the heating of the cooling fluid.

6. The method of claim 1, wherein adjusting the cooling comprises:
performing a coarse cooling power adjustment by variably obstructing the flow of the cooling fluid; and
performing a fine cooling power adjustment by controlling a heating of the cooling fluid.

7. The method of claim 1, further comprising adjusting the cooling supplied by the cooling fluid according to an indicator of a temperature of the radio-frequency coil while applying the radio-frequency pulse set to the sample.

8. The method of claim 1, wherein a difference in time between a start of anticipatively adjusting the cooling supplied by the cooling fluid and a start of applying the radio-frequency pulse set is substantially equal to a difference between a timescale of a cooling effect of adjusting the cooling supplied by the cooling fluid on the radio-frequency coil and a timescale of a heating effect of applying the radio-frequency pulse set on the radio-frequency coil.

9. The method of claim 1, wherein the cooling fluid is a cryogenic cooling fluid.

10. A method of temperature regulation of NMR circuit for performing nuclear magnetic resonance measurements comprising:
anticipatively counteracting a thermal effect of power dissipation in a nuclear magnetic resonance circuit by adjusting a cooling supplied by a cryogenic cooling fluid to the nuclear magnetic resonance circuit for a cooling time period preceding a heating effect of an application of radio-frequency power to the nuclear magnetic resonance circuit, thereby stabilizing a temperature of the nuclear magnetic resonance circuit; and
applying a radio-frequency pulse set to the nuclear resonance circuit to perform a nuclear magnetic resonance measurement on a sample to obtain data from sample of interest.

11. The method of claim 10, wherein adjusting the cooling comprises variably obstructing a flow of the cooling fluid.

12. The method of claim 10, wherein adjusting the cooling comprises controlling a heating of the cooling fluid.

13. The method of claim 10, wherein adjusting the cooling comprises:
performing a coarse cooling power adjustment by variably obstructing the flow of the cooling fluid; and
performing a fine cooling power adjustment by controlling a heating of the cooling fluid.

14. The method of claim 10, further comprising adjusting the cooling supplied by the cooling fluid according to an indicator of a temperature of the radio-frequency coil while applying the radio-frequency pulse set to the sample.

15. The method of claim 10, wherein a difference in time between a start of adjusting the cooling supplied by the cooling fluid and a start of applying the radio-frequency pulse set is substantially equal to a difference between a timescale of a cooling effect of adjusting the cooling supplied by the cooling fluid on the radio-frequency coil and a timescale of a heating effect of applying the radio-frequency pulse set on the radio-frequency coil.

16. A nuclear magnetic resonance apparatus comprising:
a nuclear magnetic resonance probe comprising a radio-frequency coil;
a cryogenic cooling fluid conduit establishing a thermal communication between a cryogenic cooling fluid and the radio-frequency coil;
a cryogenic cooling regulator fluidically coupled to the cryogenic cooling conduit, the cryogenic cooling regulator controlling a cooling supplied by the cryogenic cooling fluid to the radio-frequency coil; and
a cooling control system connected to the cryogenic cooling regulator, wherein the cooling control system generates an indicator of an anticipated time-averaged power for a radio-frequency pulse set to be applied using the radio-frequency coil, and controls the cryogenic cooling regulator to anticipatively adjust the cooling supplied by the cryogenic cooling fluid to the radio-frequency coil according to the indicator of the anticipated time-averaged power.

17. The apparatus of claim 16, wherein the cryogenic cooling regulator comprises a mass flow controller.

18. The apparatus of claim 16, wherein the cryogenic cooling regulator comprises a cryogenic fluid heater, of a heating effect of applying the radio-frequency pulse set on the radio-frequency coil.

19. The apparatus of claim 16, wherein the cooling control system sets a difference in time between a start of anticipatively adjusting the cooling supplied by the cooling fluid and a start of applying the radio-frequency pulse set substantially equal to a difference between a timescale of a cooling effect of adjusting the cooling supplied by the cooling fluid on the radio-frequency coil and a timescale of a heating effect of applying the radio-frequency pulse set on the radio-frequency coil.

* * * * *